(12) United States Patent
Ku et al.

(10) Patent No.: US 11,909,447 B2
(45) Date of Patent: Feb. 20, 2024

(54) OPTICAL TRANSCEIVER MODULE

(71) Applicant: Delta Electronics, Inc., Taoyuan (TW)

(72) Inventors: Chia-Lun Ku, Taoyuan (TW);
Tun-Chuan Chen, Taoyuan (TW);
Chen-Mao Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 344 days.

(21) Appl. No.: 17/351,703

(22) Filed: Jun. 18, 2021

(65) Prior Publication Data
US 2022/0182148 A1 Jun. 9, 2022

(30) Foreign Application Priority Data

Dec. 3, 2020 (CN) .......................... 202022888499.8

(51) Int. Cl.
*H04B 10/40* (2013.01)
*H05K 5/02* (2006.01)

(52) U.S. Cl.
CPC ........... *H04B 10/40* (2013.01); *H05K 5/0217* (2013.01)

(58) Field of Classification Search
CPC .... H04B 10/40; G02B 6/4277; G02B 6/4257; G02B 6/4262
See application file for complete search history.

(56) References Cited

U.S. PATENT DOCUMENTS

| 6,530,785 B1 | 3/2003 | Hwang |
| 6,942,395 B1 | 9/2005 | Chuan et al. |
| 7,070,446 B2 | 7/2006 | Henry et al. |
| 7,866,993 B2 | 1/2011 | Ohsumi |

(Continued)

FOREIGN PATENT DOCUMENTS

| CN | 206274709 U | 6/2017 | |
| CN | 108037568 A * | 5/2018 | ........... G02B 6/4261 |

(Continued)

OTHER PUBLICATIONS

Yi, Ye; Zheng Zhaofeng; Huang Zining; Jiaxi Kan, "Optical module", May 15, 2018, O Net Tech ShenZhen Co. Ltd., Entire Document (Translation of CN 108037568). (Year: 2018).*

(Continued)

*Primary Examiner* — Stephen S Sul
(74) *Attorney, Agent, or Firm* — KIRTON McCONKIE; Evan R. Witt

(57) ABSTRACT

An optical transceiver module includes a first housing, a second housing, an engagement component, a conductive body, and a circuit board. The first housing has a first sidewall and a first groove. The first groove is closer to a central line of a major axis of the first housing than the first sidewall. The second housing is assembled with the first housing. The second housing has a second sidewall. The second sidewall is extended into the first groove. The engagement component has a first engagement portion. The first engagement portion is extended between the first sidewall and the second sidewall. The conductive body is disposed between the first groove and the second sidewall. The circuit board is disposed between the first housing and the second housing to perform photoelectric conversion. Therefore, the stroke of the engagement component can be fixed, and the electromagnetic interference can be reduced.

10 Claims, 12 Drawing Sheets

(56) References Cited

U.S. PATENT DOCUMENTS

| | | | |
|---|---|---|---|
| 11,271,348 B1* | 3/2022 | Chen | H01R 12/724 |
| 2005/0018979 A1* | 1/2005 | Mizue | G02B 6/4277 |
| | | | 385/92 |
| 2008/0315528 A1* | 12/2008 | Moore | H05K 9/0058 |
| | | | 277/653 |
| 2011/0206328 A1 | 8/2011 | Wang | |
| 2012/0177379 A1* | 7/2012 | Edwards | H05K 9/0058 |
| | | | 398/135 |
| 2014/0196943 A1* | 7/2014 | Hirschy | G02B 6/4246 |
| | | | 174/382 |
| 2018/0292620 A1* | 10/2018 | Zheng | H04B 10/40 |
| 2020/0341219 A1* | 10/2020 | Zhou | G02B 6/426 |

FOREIGN PATENT DOCUMENTS

| | | | | |
|---|---|---|---|---|
| CN | 209674065 U | 11/2019 | | |
| CN | 210119607 U | 2/2020 | | |
| TW | M545384 U | 7/2017 | | |
| TW | I641883 B | 11/2018 | | |
| TW | 202015363 A | 4/2020 | | |
| TW | 1708086 B * | 10/2020 | | G02B 6/4261 |

OTHER PUBLICATIONS

Lu, Chen-Mao; Chung, Wen-Ching; Su, Li-Hua, "Optical Transceiver", Oct. 21, 2020, Delta Electronics Inc., Entire Document (Translation of TW 1708086). (Year: 2020).*

* cited by examiner

OPTICAL TRANSCEIVER MODULE

FIELD OF THE INVENTION

The present invention relates to an optical transceiver module, and more particularly to an optical transceiver module reducing electromagnetic interferences.

BACKGROUND OF THE INVENTION

Optical transceiver modules are widely applied in information and communication fields. The common ones include quad small form-factor pluggable (QSFP) transceiver and quad small form-factor pluggable double density (QSFP-DD) transceiver. With growing of the transmission requirements of optical transceiver modules, the requirements of reducing the electromagnetic interferences are also increased.

In traditional optical transceiver modules, openings or recesses are usually formed on the housing for latch and handle connections. However, since the latch is exposed in those connections, the assembly is easier to come off, and the gap is larger and easier for the assembly to shake. In addition, because a larger space is necessary for those connections, the radiation of electromagnetic interferences is easier to spread. Furthermore, when the optical transceiver module is connected to a system connector, the optical transceiver module cannot be effectively and tightly contacted with the system connector due to the thickness and structure of the latch itself.

Therefore, there is a need of providing an optical transceiver module distinct from prior art in order to solve the above drawbacks.

SUMMARY OF THE INVENTION

Some embodiments of the present invention are to provide an optical transceiver module in order to overcome at least one of the above-mentioned drawbacks encountered by prior art.

The present invention provides an optical transceiver module. By extending the first engagement portion between the first sidewall and the second sidewall, the plug stroke of the engagement portion can be fixed, so that the engagement portion is not easy to come off.

The present invention also provides an optical transceiver module. Through the cover structure of assembling the first housing and the second housing, the gaps between the first housing, the second housing, and the engagement component are reduced to the lowest, so that the assembly is not easy to shake, and further the electromagnetic interferences are effectively reduced.

The present invention also provides an optical transceiver module. Since the engagement portion of the engagement component is covered inside the first housing and the second housing, the first housing and the second housing can be completely contacted with spring plates of a system connector for grounding when the optical transceiver module is installed to the system connector. The engagement component will not be directly contacted with the spring plates, thereby further reducing the electromagnetic interferences.

In accordance with an aspect of the present invention, there is provided an optical transceiver module. The optical transceiver module includes a first housing, a second housing, an engagement component, a conductive body, and a circuit board. The first housing has a first sidewall and a first groove. The first groove is closer to a central line of a major axis of the first housing than the first sidewall. The second housing is assembled with the first housing. The second housing has a second sidewall. The second sidewall is extended into the first groove. The engagement component has a first engagement portion. The first engagement portion is extended between the first sidewall and the second sidewall. The conductive body is disposed between the first groove and the second sidewall. The circuit board is disposed between the first housing and the second housing to perform photoelectric conversion.

In accordance with another aspect of the present invention, there is provided an optical transceiver module. The optical transceiver module includes a first housing, a second housing, an engagement component, a conductive body, and a circuit board. The second housing is assembled with the first housing to at least form a first space and a second space. The engagement component has a first engagement portion. The first engagement portion is accommodated in the second space and closed by the first housing and the second housing on a minor axis direction and a vertical direction of the first housing and the second housing. The conductive body is disposed between the first housing and the second housing. The circuit board is disposed in the first space to perform photoelectric conversion.

In accordance with another aspect of the present invention, there is provided an optical transceiver module. The optical transceiver module includes a first housing, a second housing, an engagement component, a conductive body, and a circuit board. The first housing has a first outer sidewall and a first groove. The second housing has a second outer sidewall and an inner sidewall. The first outer sidewall is assembled with the second outer sidewall, a second groove is formed between the second outer sidewall and the inner sidewall, and the inner sidewall is intruded into the first groove. The engagement component has at least an engagement portion. The engagement portion is disposed in the second groove. The conductive body is disposed in the first groove. The circuit board is disposed between the first housing and the second housing to perform photoelectric conversion.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
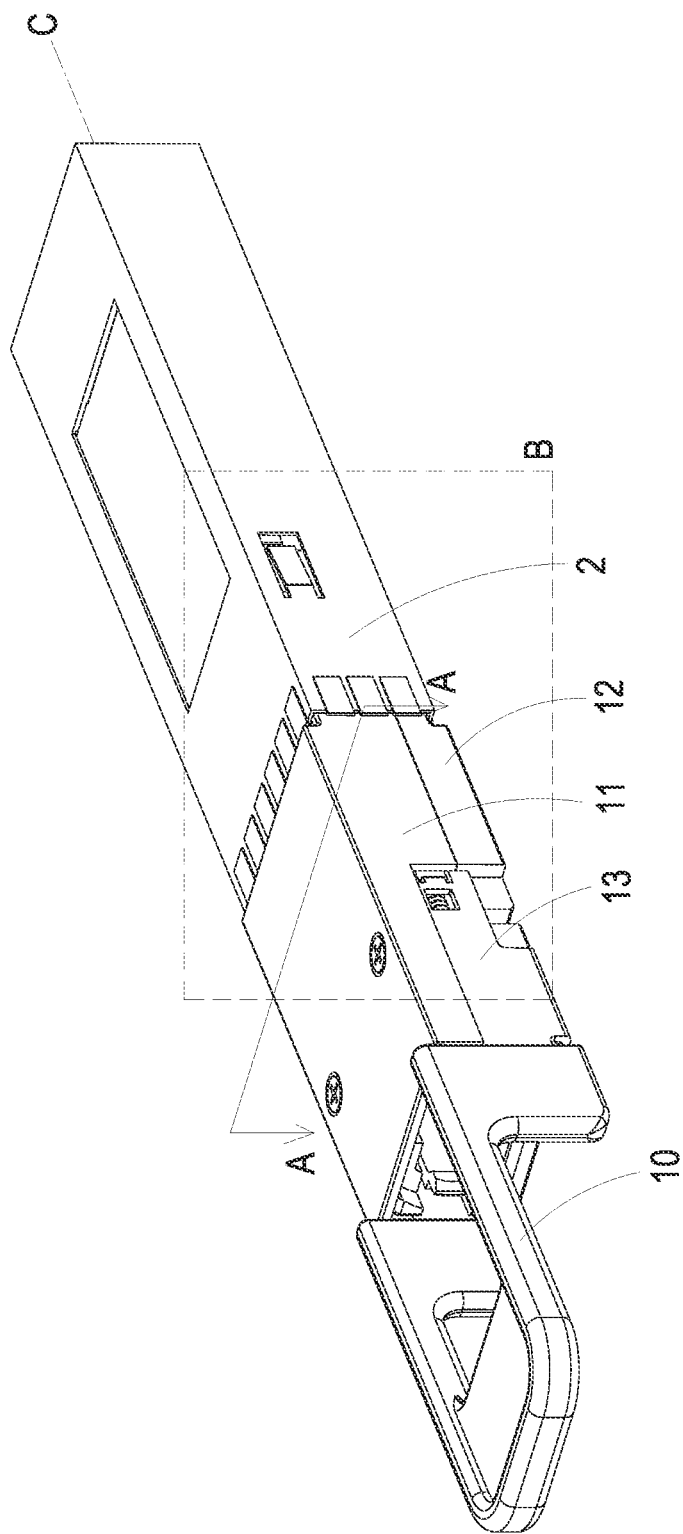
FIG. 1 schematically illustrates the structural view of an optical transceiver module installed to a system connector according to an embodiment of the present invention.
Figure 2:
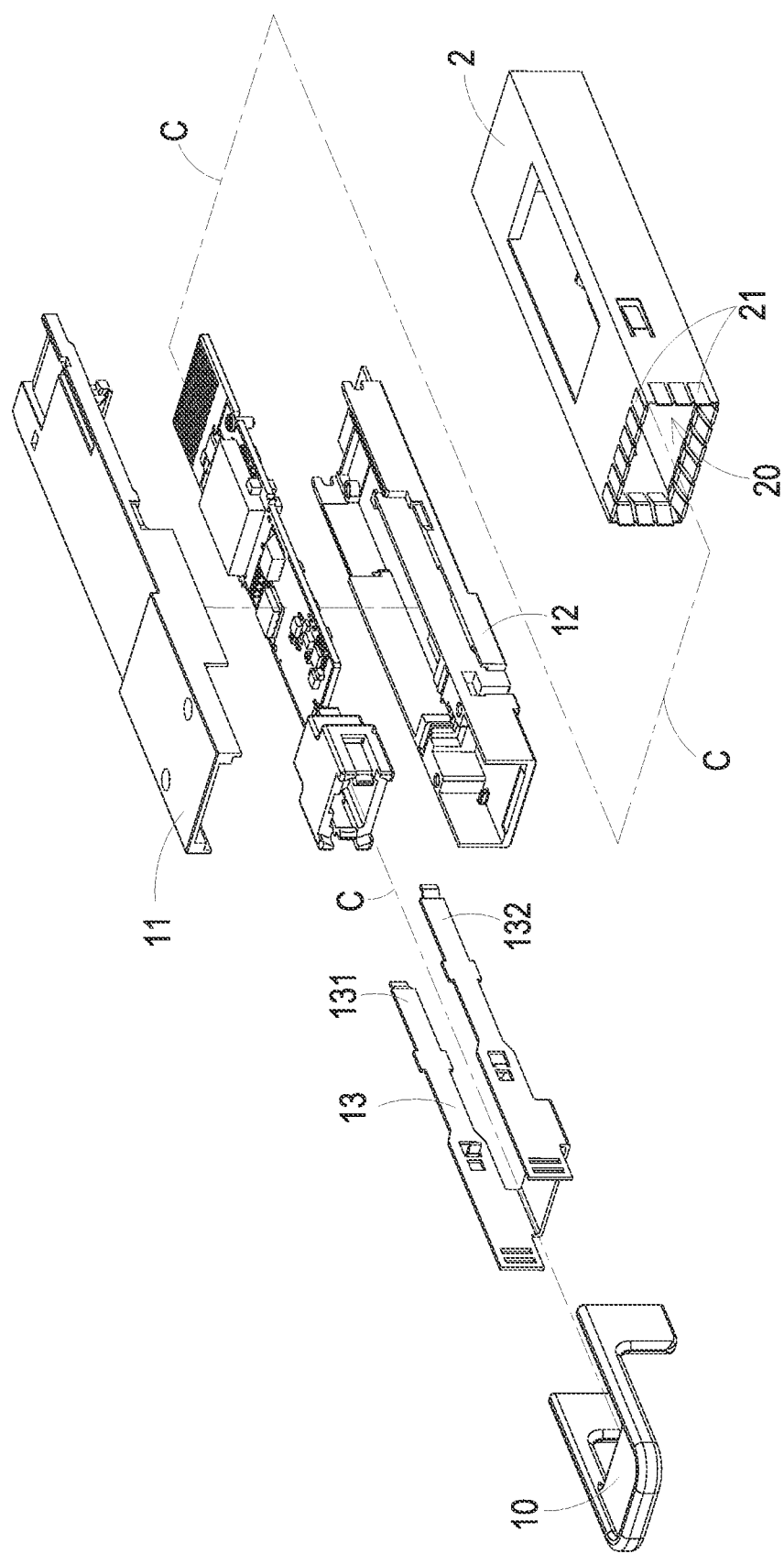
FIG. 2 schematically illustrates the exploded view of an optical transceiver module installed to a system connector according to an embodiment of the present invention.
Figure 3:
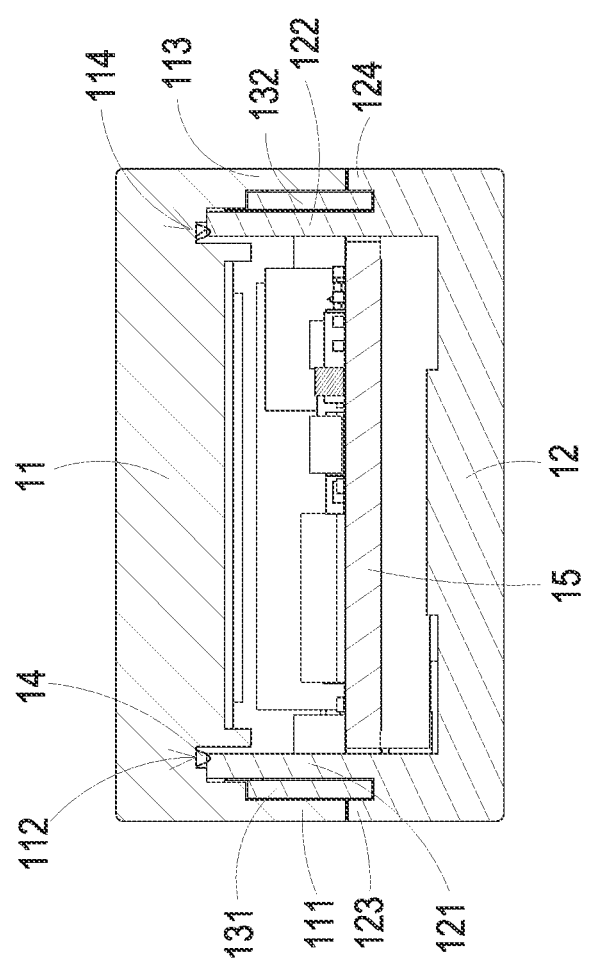
FIG. 3 schematically illustrates the sectional view of the line A-A shown in FIG. 1 showing an optical transceiver module which is not installed to a system connector.

Please refer to FIG. 1, FIG. 2, and FIG. 3. FIG. 1 schematically illustrates the structural view of an optical transceiver module installed to a system connector according to an embodiment of the present invention. FIG. 2 schematically illustrates the exploded view of an optical transceiver module installed to a system connector according to an embodiment of the present invention. FIG. 3 schematically illustrates the sectional view of the line A-A shown in FIG. 1 showing an optical transceiver module which is not installed to a system connector. As shown in FIG. 1, FIG. 2, and FIG. 3, an optical transceiver module according to an embodiment of the present invention includes a first housing 11, a second housing 12, an engagement component 13, a conductive body 14, and a circuit board 15. The first housing 11 has a first sidewall 111 and a first groove 112. The first groove 112 is closer to a central line C of a major axis of the first housing 11 than the first sidewall 111. A wall of the first groove 112 is protruded from a surface of the first housing 11 or not protruded from the first housing 11. The second housing 12 is assembled with the first housing 11. The second housing 12 has a second sidewall 121. The second sidewall 121 is extended into the first groove 112. The engagement component 13 has a first engagement portion 131. The first engagement portion 131 is extended between the first sidewall 111 and the second sidewall 121. The conductive body 14 is disposed between the first groove 112 and the second sidewall 121. The circuit board 15 is disposed between the first housing 11 and the second housing 12 to perform photoelectric conversion. Therefore, the stroke of the engagement component 13 can be fixed, so that the engagement portion 131 is not easy to come off. In addition, through the cover structure of assembling the first housing 11 and the second housing 12, the gaps between the first housing 11, the second housing 12, and the engagement component 13 are reduced to the lowest, so that the assembly is not easy to shake, and further the electromagnetic interferences are effectively reduced.

In some embodiments, the optical transceiver module further includes a handle 10. The handle 10, the engagement component 13, and the assembly of the first housing 11 and the second housing 12 are sequentially assembled along the central line C of the major axes of the first housing 11 and the second housing 12, but not limited herein. When the optical transceiver module is going to be installed to a system connector 2 after the assembling of the optical transceiver module is completed, the optical transceiver module is plugged into a rectangular opening 20 of the system connector 2 along the central line C of the major axes of the first housing 11 and the second housing 12 and is all-around grounded with a plurality of spring plates 21 of the system connector 2. Additionally, the first housing 11 and the second housing 12 are preferably made of zinc alloy, and the conductive body 14 is preferably conductive glue, but not limited herein. The conductive body 14 is disposed between the first housing 11 and the second housing 12, and is preferably disposed in the first groove 112.

In some embodiments, the first housing 11 of the optical transceiver module of the present invention has a third sidewall 113 and a second groove 114. The second housing 12 of the optical transceiver module further has a fourth sidewall 122. The second groove 114 is closer to the central line C of the major axis of the first housing than the third sidewall 113, and the fourth sidewall 122 is extended into the second groove 114. Furthermore, the engagement component 13 further has a second engagement portion 132. The second engagement portion 132 is extended between the third sidewall 113 and the fourth sidewall 122. Preferably, each of the first engagement portion 131 and the second engagement portion 132 is a strip-shaped engagement portion, but not limited herein. In addition, the second housing 12 further has a fifth sidewall 123 and a sixth sidewall 124. The fifth sidewall 123 is butted with the first sidewall 111, and the sixth sidewall 124 is butted with the third sidewall 113.

Please refer to FIG. 3 again. The optical transceiver module of the present invention can be realized in another way. In brief, the second housing 12 of the optical transceiver module of the present invention is assembled with the first housing 11 to at least form a first space and a second space. The circuit board 15 is disposed in the first space, and the first engagement portion 131 of the engagement component 13 is accommodated in the second space. Furthermore, the first housing and the second housing are assembled to further form a third space, and the second space and the third space are respectively formed at two opposite ends of the first space. The second engagement portion 132 of the engagement component 13 is accommodated in the third space. The first engagement portion 131 and the second engagement portion 132 are disposed between the first housing 11 and the second housing 12 on a minor axis direction and a vertical direction of the first housing 11 and the second housing 12, i.e., the first engagement portion 131 and the second engagement portion 132 are covered by the first housing 11 and the second housing 12. In addition, the first space, the second space, and the third space are closed by the first housing 11 and the second housing 12 on a direction of the central line C of the major axis. In other words, the first space, the second space, and the third space are closed by the first housing 11 and the second housing 12 on the minor axis direction and the vertical direction of the first housing 11 and the second housing 12.

In some embodiments, the optical transceiver module of the present invention can be realized in another way. Please refer to FIG. 3 again. The first housing 11 of the optical transceiver module of the present invention can be regarded as having a first outer sidewall and a first groove 112, which are respectively the first sidewall 111 and the first groove 112 as shown in FIG. 3. The second housing 12 can be regarded as having a second outer sidewall and an inner sidewall, which are respectively the fifth sidewall 123 and the second sidewall 121, and the first outer sidewall is assembled with the second outer sidewall. The second groove is formed between the second outer sidewall and the inner sidewall, i.e., the second groove is formed between the fifth sidewall 123 and the second sidewall 121, and the inner sidewall is intruded into the first groove 112. The engagement component 13 has at least an engagement portion, which is the first engagement portion 131 as shown in FIG. 3. The engagement portion is disposed in the second groove. The conductive body 14 is disposed in the first groove 112. In some embodiments, the first outer sidewall, the engagement portion, and the inner sidewall are sequentially arranged from outside to inside, but not limited herein. In some embodiments, a height of the inner sidewall is greater than a height of the second outer sidewall, but not limited herein.

Figure 4:
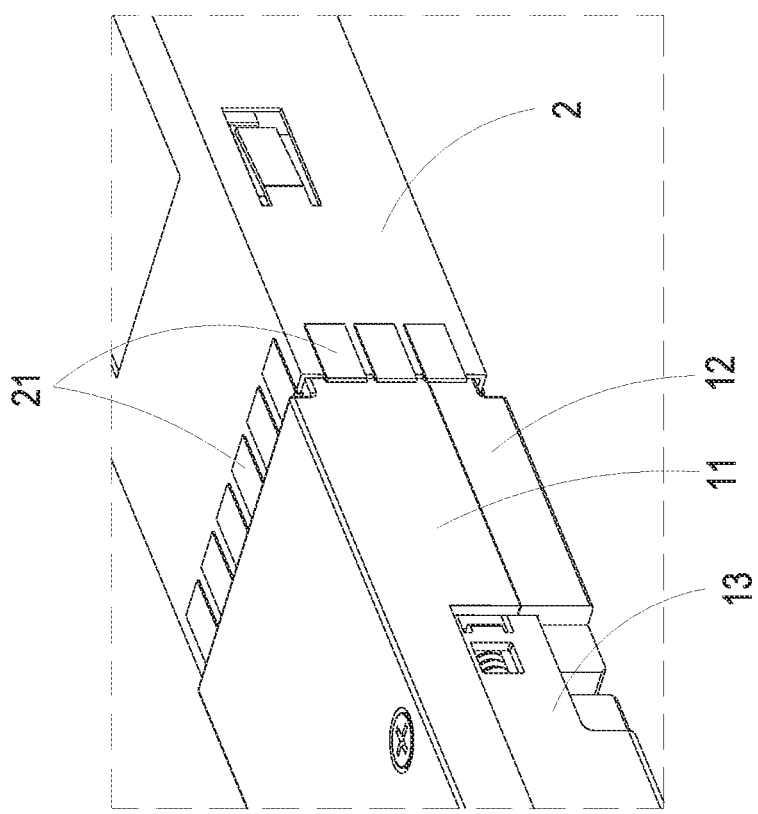
FIG. 4 schematically illustrates the detailed structure of the area B shown in FIG. 1.

Please refer to FIG. 3 and FIG. 4. FIG. 4 schematically illustrates the detailed structure of the area B shown in FIG. 1. As shown in FIG. 3 and FIG. 4, when the engagement component 13 is inserted into the first housing 11 and the second housing 12, the first engagement portion 131 of the engagement component 13 is covered by the first sidewall 111 of the first housing 11 and the second sidewall 121 and the fifth sidewall 123 of the second housing 12, and the second engagement portion 132 of the engagement component 13 is covered by the third sidewall 113 of the first housing 11 and the fourth sidewall 122 and the sixth sidewall 124 of the second housing 12. As a result, the first engagement portion 131 and the second engagement portion 132 of the engagement component 13 are not exposed outside the first housing 11 and the second housing 12. Therefore, the first housing 11 and the second housing 12 can be completely contacted with spring plates 21 of a system connector 2 for grounding when the optical transceiver module is installed to the system connector 2. The engagement component 13 will not be directly contacted with the spring plates 21, thereby reducing the electromagnetic interferences.

Figure 5:
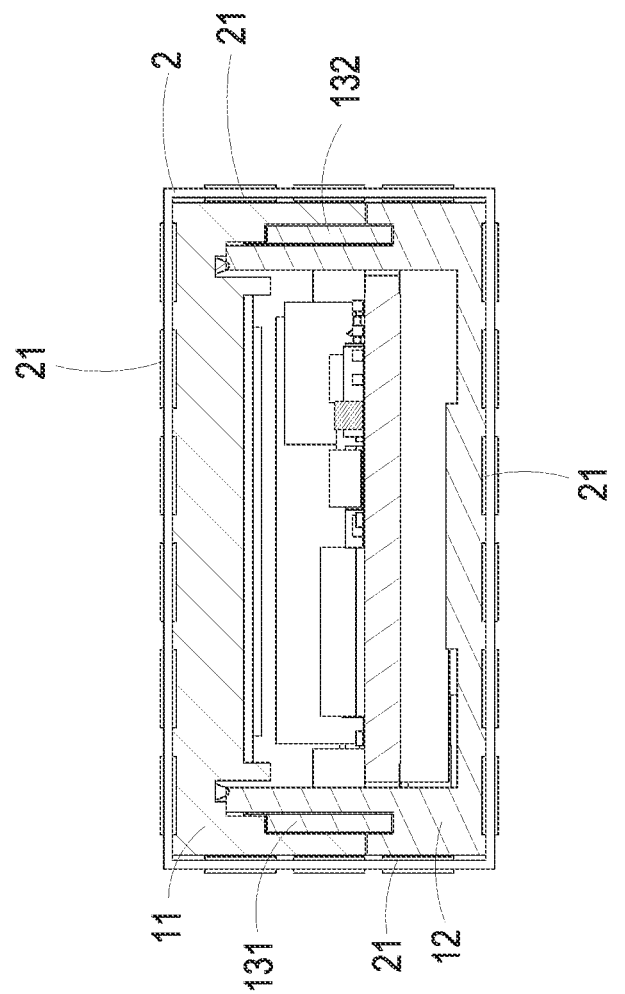
FIG. 5 schematically illustrates the sectional view of the line A-A shown in FIG. 1 showing an optical transceiver module which is installed to a system connector.
Figure 6:
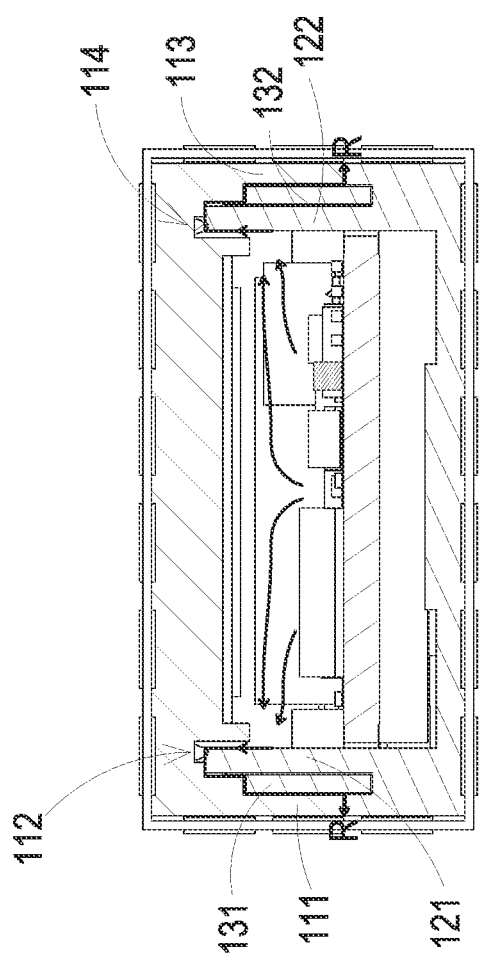
FIG. 6 schematically illustrates the path of the radiation of electromagnetic interferences spreading in the sectional view shown in FIG. 5.

Please refer to FIG. 1, FIG. 5, and FIG. 6. FIG. 5 schematically illustrates the sectional view of the line A-A shown in FIG. 1 showing an optical transceiver module which is installed to a system connector. FIG. 6 schematically illustrates the path of the radiation of electromagnetic interferences spreading in the sectional view shown in FIG. 5. As shown in FIG. 1, FIG. 5, and FIG. 6, after assembling the optical transceiver module of the present invention, an assembly of the first housing 11 and the second housing 12 is pluggably installed to a system connector 2. The system connector 2 has a rectangular opening 20 and a plurality of spring plates 21. The spring plates 21 are peripherally disposed around the rectangular opening 20. In addition, after assembling the first housing 11 with the second housing 12, the first housing 11 and the second housing 12 commonly define four sides. In specific, the four sides include two pairs of two opposite sides which are parallel to each other. Each of the sides is perpendicular to an adjacent one of the four sides. In this embodiment, the four sides are in contact with the spring plates 21 to implement all-around grounding. Meanwhile, the first engagement portion 131 and the spring plates 21 are isolated by the first housing 11 and the second housing 12, and the second engagement portion 132 and the spring plates 21 are isolated by the first housing 11 and the second housing 12.

Figure 7:
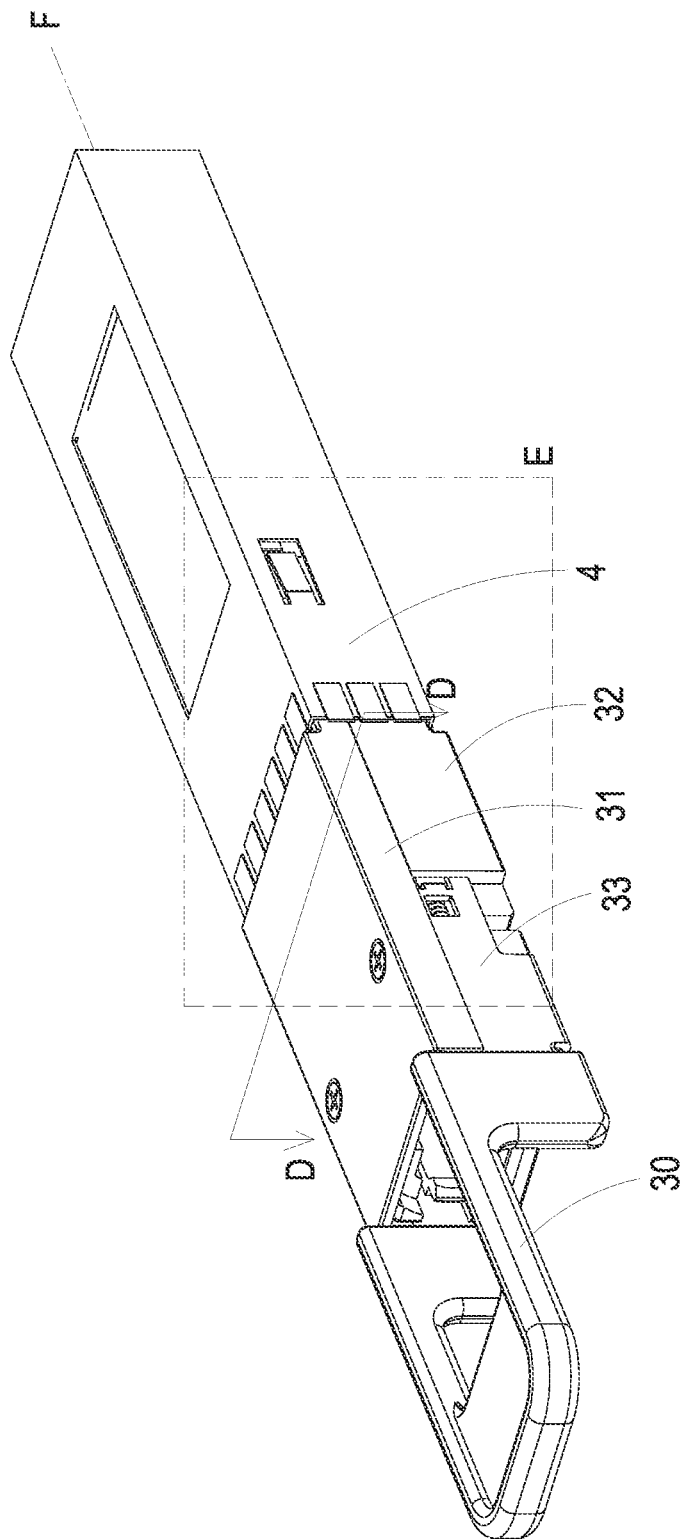
FIG. 7 schematically illustrates the structural view of an optical transceiver module installed to a system connector according to an embodiment of the present invention.
Figure 8:
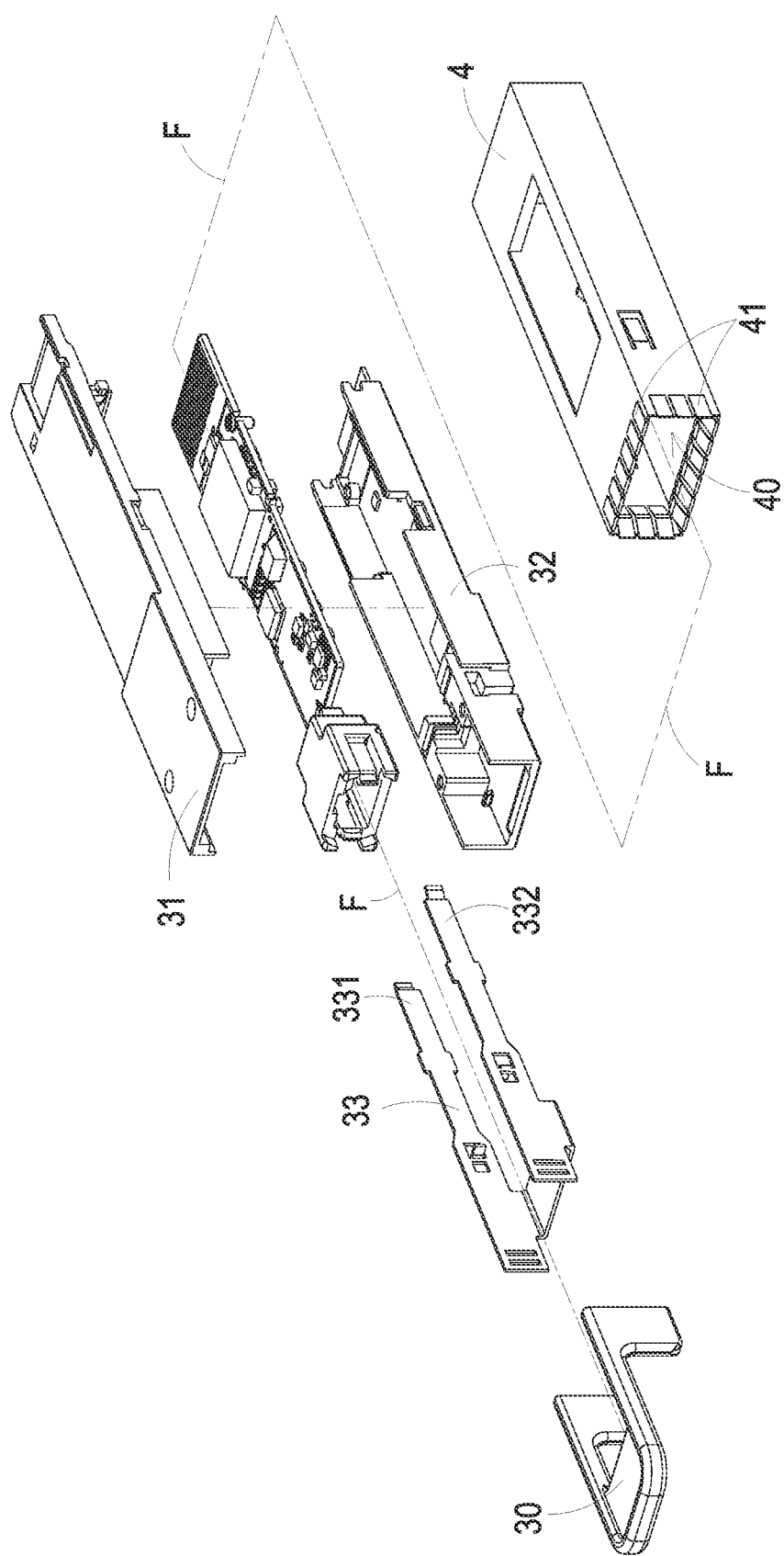
FIG. 8 schematically illustrates the exploded view of an optical transceiver module installed to a system connector according to an embodiment of the present invention.
Figure 9:
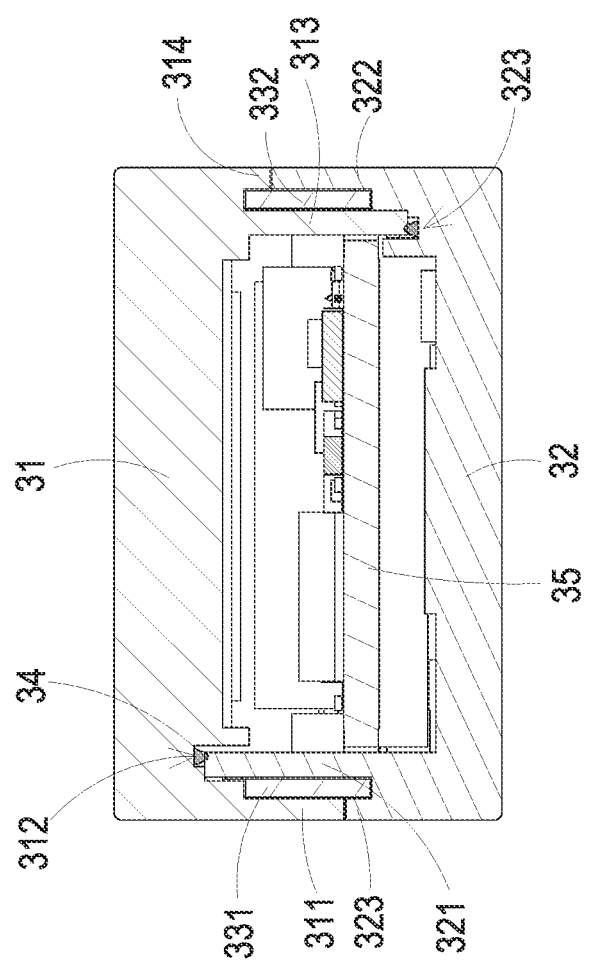
FIG. 9 schematically illustrates schematically illustrates the sectional view of the line D-D shown in FIG. 7 showing an optical transceiver module which is not installed to a system connector.

Please refer to FIG. 7, FIG. 8, and FIG. 9. FIG. 7 schematically illustrates the structural view of an optical transceiver module installed to a system connector according to an embodiment of the present invention. FIG. 8 schematically illustrates the exploded view of an optical transceiver module installed to a system connector according to an embodiment of the present invention. FIG. 9 schematically illustrates schematically illustrates the sectional view of the line D-D shown in FIG. 7 showing an optical transceiver module which is not installed to a system connector. As shown in FIGS. 7-9, an optical transceiver module according to an embodiment of the present invention includes a first housing 31, a second housing 32, an engagement component 33, a conductive body 34, and a circuit board 35. The first housing has a first sidewall 311 and a first groove 312. The first groove 312 is closer to a central line F of a major axis of the first housing 31 than the first sidewall 311. The second housing 32 is assembled with the first housing 31. The second housing 32 has a second sidewall 321. The second sidewall 321 is extended into the first groove 312. The engagement component 33 has a first engagement portion 331. The first engagement portion 331 is extended between the first sidewall 311 and the second sidewall 321. The conductive body 34 is disposed between the first groove 312 and the second sidewall 321. The circuit board 35 is disposed between the first housing 31 and the second housing 32 to perform photoelectric conversion.

In some embodiments, the first housing 31 of the optical transceiver module of the present invention further has a third sidewall 313, the second housing 32 of the optical transceiver module of the present invention further has a fourth sidewall 322 and a second groove 323. The second groove 323 is closer to the central line F of a major axis of the second housing 32 than the fourth sidewall 322. The third sidewall 313 is extended into the second groove 323. Furthermore, the engagement component 32 further has a second engagement portion 332. The second engagement portion 332 is extended between the third sidewall 313 and the fourth sidewall 322. In addition, the second housing 32 has a fifth sidewall 324, and the first housing has a sixth sidewall 314. The fifth sidewall 324 is butted with the first sidewall 311, and the sixth sidewall 314 is butted with the fourth sidewall 322.

Figure 10:
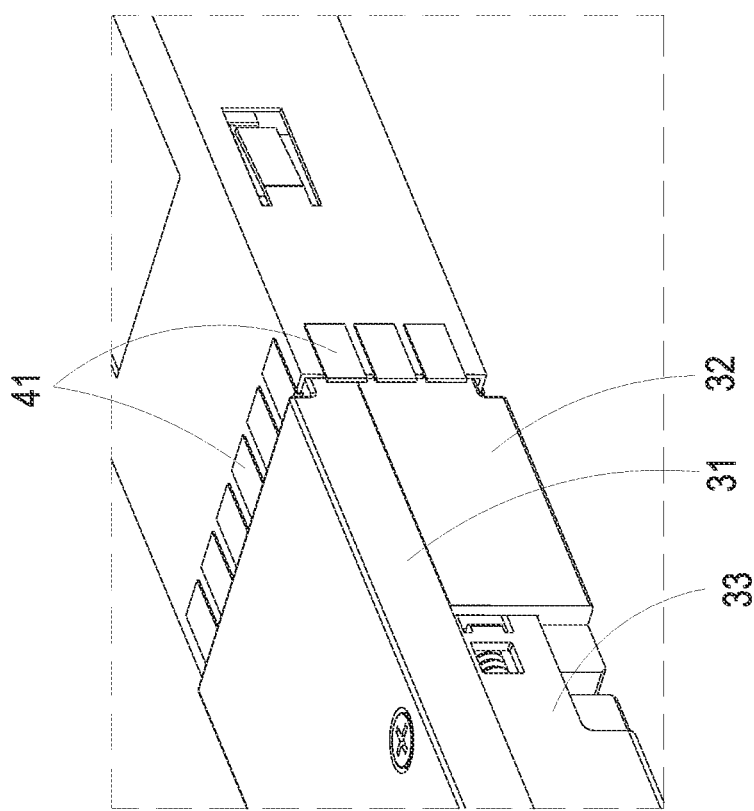
FIG. 10 schematically illustrates schematically illustrates the detailed structure of the area E shown in FIG. 7.

Please refer to FIG. 9 and FIG. 10. FIG. 10 schematically illustrates schematically illustrates the detailed structure of the area E shown in FIG. 7. As shown in FIG. 9 and FIG. 10, when the engagement component 33 is inserted into the first housing 31 and the second housing 32, the first engagement portion 331 of the engagement component 33 is covered by the first sidewall 311 of the first housing 31 and the second sidewall 321 and the fifth sidewall 324 of the second housing 32, and the second engagement portion 332 of the engagement component 33 is covered by the third sidewall 313 and the sixth sidewall 314 of the first housing 31 and the fourth sidewall 322 of the second housing 32. As a result, the first engagement portion 331 and the second engagement portion 332 of the engagement component 33 are not exposed outside the first housing 31 and the second housing 32.

Figure 11:
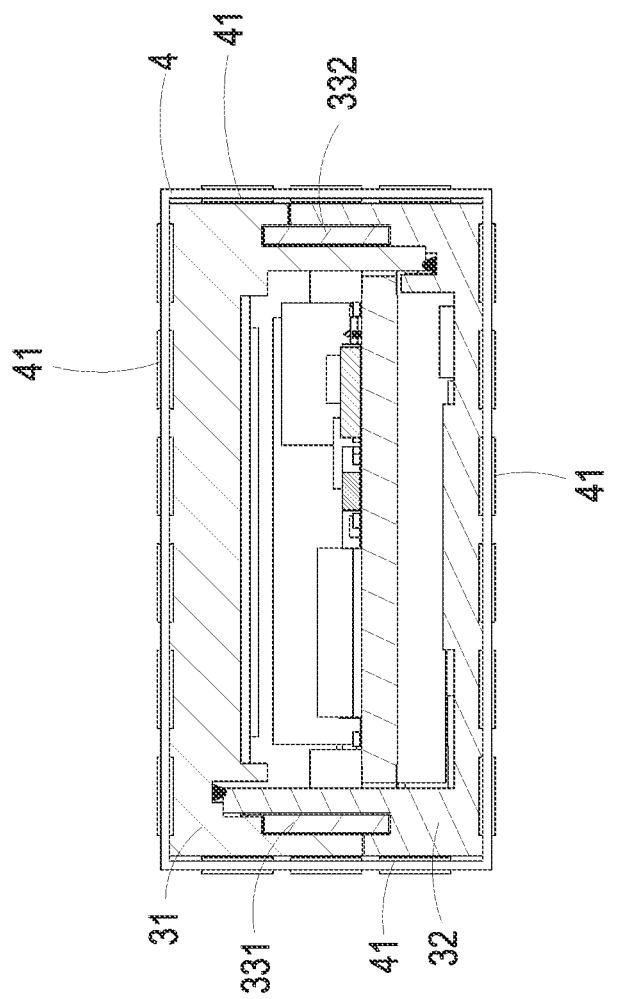
FIG. 11 schematically illustrates schematically illustrates the sectional view of the line D-D shown in FIG. 7 showing an optical transceiver module which is installed to a system connector.
Figure 12:
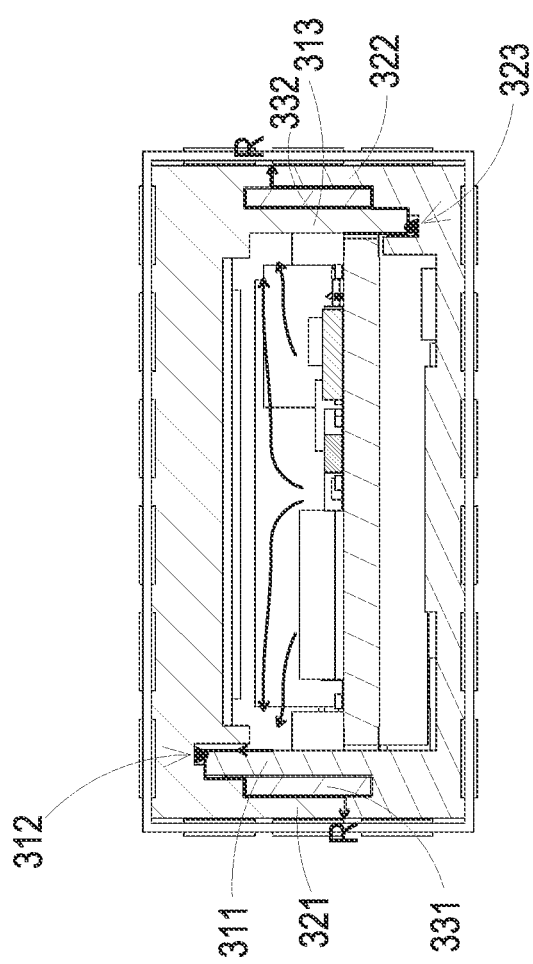
FIG. 12 schematically illustrates the path of the radiation of electromagnetic interferences spreading in the sectional view shown in FIG. 11.

Please refer to FIG. 7, FIG. 11, and FIG. 12. FIG. 11 schematically illustrates schematically illustrates the sectional view of the line D-D shown in FIG. 7 showing an optical transceiver module which is installed to a system connector. FIG. 12 schematically illustrates the path of the radiation of electromagnetic interferences spreading in the sectional view shown in FIG. 11. As shown in FIG. 7, FIG. 11, and FIG. 12, after assembling the optical transceiver module of the present invention, an assembly of the first housing 31 and the second housing 32 is pluggably installed to a system connector 4. The system connector 4 has a rectangular opening 40 and a plurality of spring plates 41. The spring plates 41 are peripherally disposed around the rectangular opening 40. In addition, after assembling the first housing 31 with the second housing 32, the first housing 31 and the second housing 32 commonly define four sides. In specific, the four sides include two pairs of two opposite sides which are parallel to each other. Each of the sides is perpendicular to an adjacent one of the four sides. In this embodiment, the four sides are in contact with the spring plates 41 to implement all-around grounding. Meanwhile, the first engagement portion 331 and the spring plates 41 are isolated by the first housing 31 and the second housing 32, and the second engagement portion 332 and the spring plates 41 are isolated by the first housing 31 and the second housing 32.

From the above description, the present invention provides an optical transceiver module. By extending the first engagement portion between the first sidewall and the second sidewall, the plug stroke of the engagement portion can be fixed, so that the engagement portion is not easy to come off. Meanwhile, through the cover structure of assembling the first housing and the second housing, the gaps between the first housing, the second housing, and the engagement component are reduced to the lowest, so that the assembly is not easy to shake, and further the electromagnetic interferences are effectively reduced. In addition, since the engagement portion of the engagement component is covered inside the first housing and the second housing, the first housing and the second housing can be completely contacted with spring plates of a system connector for grounding when the optical transceiver module is installed to the system connector. The engagement component will not be directly contacted with the spring plates, thereby further reducing the electromagnetic interferences.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optical transceiver module, comprising:
  a first housing having a first sidewall and a first groove, wherein the first groove is closer to a central line of a major axis of the first housing than the first sidewall;
  a second housing assembled with the first housing, wherein the second housing has a second sidewall, and the second sidewall is extended into the first groove;
  an engagement component having a first engagement portion, wherein the first engagement portion is extended between the first sidewall and the second sidewall;
  a conductive body disposed between the first groove and the second sidewall; and
  a circuit board disposed between the first housing and the second housing to perform photoelectric conversion,
  wherein the second housing further has a fifth sidewall, and the fifth sidewall is butted with the first sidewall.

2. The optical transceiver module according to claim 1, wherein the first engagement portion is a strip-shaped engagement portion.

3. The optical transceiver module according to claim 1, wherein a wall of the first groove is protruded from a surface of the first housing or not protruded from the first housing.

4. The optical transceiver module according to claim 1, wherein the first housing further has a third sidewall and a second groove, and the second housing further has a fourth sidewall, and wherein the second groove is closer to the central line of the major axis of the first housing than the third sidewall, and the fourth sidewall is extended into the second groove.

5. The optical transceiver module according to claim 4, wherein the engagement component further has a second engagement portion, and the second engagement portion is extended between the third sidewall and the fourth sidewall.

6. The optical transceiver module according to claim 1, wherein the first housing further has a third sidewall, and the second housing further has a fourth sidewall and a second groove, and wherein the second groove is closer to a central line of a major axis of the second housing than the fourth sidewall, and the third sidewall is extended into the second groove.

7. The optical transceiver module according to claim 6, wherein the first housing further has a sixth sidewall, and the sixth sidewall is butted with the fourth sidewall.

8. The optical transceiver module according to claim 6, wherein the engagement component further has a second engagement portion, and the second engagement portion is extended between the third sidewall and the fourth sidewall.

9. The optical transceiver module according to claim 1, wherein an assembly of the first housing and the second housing is pluggably installed to a system connector, the system connector has a rectangular opening and a plurality of spring plates, and the plurality of spring plates are peripherally disposed around the rectangular opening.

10. The optical transceiver module according to claim 9, wherein the first housing and the second housing commonly define four sides, the four sides are in contact with the plurality of spring plates, and the first engagement portion and the plurality of spring plates are isolated by the first housing and the second housing.

* * * * *